(12) United States Patent
Funabashi

(10) Patent No.: US 9,740,109 B2
(45) Date of Patent: Aug. 22, 2017

(54) HOLDING DEVICE, LITHOGRAPHY APPARATUS, AND METHOD FOR MANUFACTURING ITEM

(71) Applicant: CANON KABUSHIKI KAISHA, Tokyo (JP)

(72) Inventor: Naoki Funabashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 80 days.

(21) Appl. No.: 14/947,702

(22) Filed: Nov. 20, 2015

(65) Prior Publication Data

US 2016/0154313 A1  Jun. 2, 2016

(30) Foreign Application Priority Data

Nov. 28, 2014 (JP) ................................ 2014-242525
Oct. 27, 2015 (JP) ................................ 2015-210712

(51) Int. Cl.
*H01L 21/683* (2006.01)
*H01L 21/687* (2006.01)
*G03F 7/20* (2006.01)

(52) U.S. Cl.
CPC .......... *G03F 7/707* (2013.01); *G03F 7/70783* (2013.01); *H01L 21/683* (2013.01); *H01L 21/687* (2013.01); *H01L 21/6838* (2013.01)

(58) Field of Classification Search
CPC ... G03F 7/707; G03F 7/70783; H01L 21/683; H01L 21/6838; H01L 21/687
See application file for complete search history.

(56) References Cited

U.S. PATENT DOCUMENTS

2009/0027649 A1*  1/2009  De Boer ................. G03F 7/707
                                                                  355/73
2014/0065553 A1    3/2014  Jang

FOREIGN PATENT DOCUMENTS

| CN | 102608872 A | 7/2012 |
|---|---|---|
| EP | 1077393 A2 | 2/2001 |
| JP | H09251948 A | 9/1997 |
| JP | H10144777 A | 5/1998 |
| JP | 2001-215716 A | 8/2001 |
| JP | 2002-009139 A | 1/2002 |
| JP | 2002217276 A | 8/2002 |
| JP | 2013232630 A | 11/2013 |
| JP | 2014150266 A | 8/2014 |

* cited by examiner

*Primary Examiner* — Michelle M Iacoletti
(74) *Attorney, Agent, or Firm* — Canon U.S.A. Inc., IP Division

(57) ABSTRACT

A holding device includes a holding member having holes for evacuating air in a space between a substrate and the holding member and an annular seal member on a lower surface of a stepped portion of the holding member for defining the space. A first region is the area of a figure having the same center as that of a plane figure of a surface of the holding member and obtained by reducing the plane figure's size by ⅔ or more and ⅘ or less. A second region is between the first region and the seal member. The holes are formed to satisfy a relationship of (total hole area in second region/area of second region)>(total hole area in sum region of first and second regions/area of sum region of first and second regions) and communicate with a pipe at a position corresponding to the first region of the holding member.

15 Claims, 9 Drawing Sheets

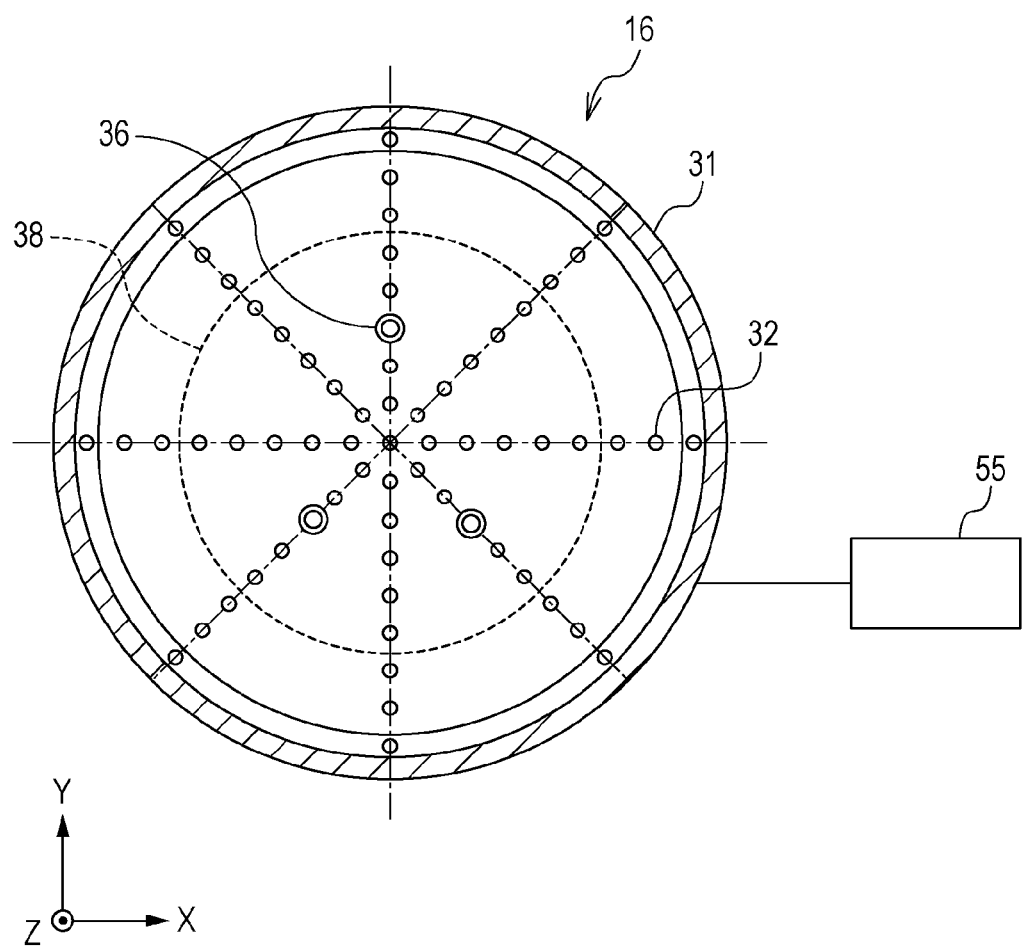

HOLDING DEVICE, LITHOGRAPHY APPARATUS, AND METHOD FOR MANUFACTURING ITEM

BACKGROUND OF THE INVENTION

Field of the Invention

The present invention relates to a holding device, a lithography apparatus and a method for manufacturing an item.

Description of the Related Art

There is a case where an exposure apparatus used in a process of manufacturing a semiconductor device or the like is provided with a substrate having surface irregularities or warpage. When the substrate is held by vacuum suction, there is a possibility that the suction force will decrease as a result of air leakage occurring due to the warpage of the peripheral edge of the substrate. In addition, when a pattern is transferred onto the substrate in a state where the suction force is small, and the surface irregularities or the warpage of the substrate is large, there is a possibility that the transferred pattern will become deformed resulting in a poor yield of the device manufactured.

Japanese Patent Laid-Open No. 2002-217276 discloses a holding device in which a seal member, which is an elastic body, is disposed over the outer periphery of a substrate-holding surface. As a result of the seal member deforming in such a manner as to follow the shape of the peripheral edge of a substrate, the possibility of the occurrence of air leakage from a space between the substrate and the substrate-holding surface is reduced, so that a suction force is increased. The substrate-holding surface of the holding device includes a plate-shaped member that has intake holes, which have the same size and the same shape and which are arranged at a certain pitch.

Like the holding device described in Japanese Patent Laid-Open No. 2002-217276, when air suction is performed by using all the intake holes, which have the same size and the same shape and which are arranged at a certain pitch, at the same time, the distribution of a negative pressure at the substrate-holding surface is uniform, or the negative pressure at the peripheral edge is smaller than that at the other portions. In view of the fact that there have been more cases where a substrate that has been largely deformed (e.g., largely warped) is transported into an exposure apparatus along with the recent increase in the variety of processes for manufacturing devices, there is a possibility that it may be difficult to correct the warpage of the peripheral edge of a substrate due to a small suction force at the peripheral edge of the substrate.

SUMMARY OF THE INVENTION

An aspect of the present invention provides a holding device and a lithography apparatus capable of providing better correction of the warpage of a substrate than in the case where air suction is performed by using the same vacuum source and by using all the intake holes, which have the same size and the same shape and which are arranged at a certain pitch, at the same time.

A holding device according to an aspect of the present invention is a holding device that is configured to hold a substrate and that includes a holding member in which a plurality of intake holes used for evacuating air in a space between a substrate and the holding member are formed and a seal member that has a ring shape and is disposed on a lower surface of a stepped portion of the holding member and that defines the space. When an inner region of a figure that is concentric with a center of a plane figure of a holding surface of the holding member and that is obtained by reducing a size of the plane figure by ⅔ or more and ⅘ or less is set as a first region, and a region between the first region and the seal member is set as a second region, the plurality of intake holes are formed in such a manner that a relationship of, ratio of total area of intake holes formed in the second region to area of the second region is greater than, ratio of the total area of intake holes formed in a sum region that includes the first region added to the second region to area of the sum region, is satisfied.

Further features of the present invention will become apparent from the following description of exemplary embodiments with reference to the attached drawings.

BRIEF DESCRIPTION OF THE DRAWINGS

FIG. 7 is a diagram illustrating a holding device according to the third embodiment.

DESCRIPTION OF THE EMBODIMENTS

Figure 1:
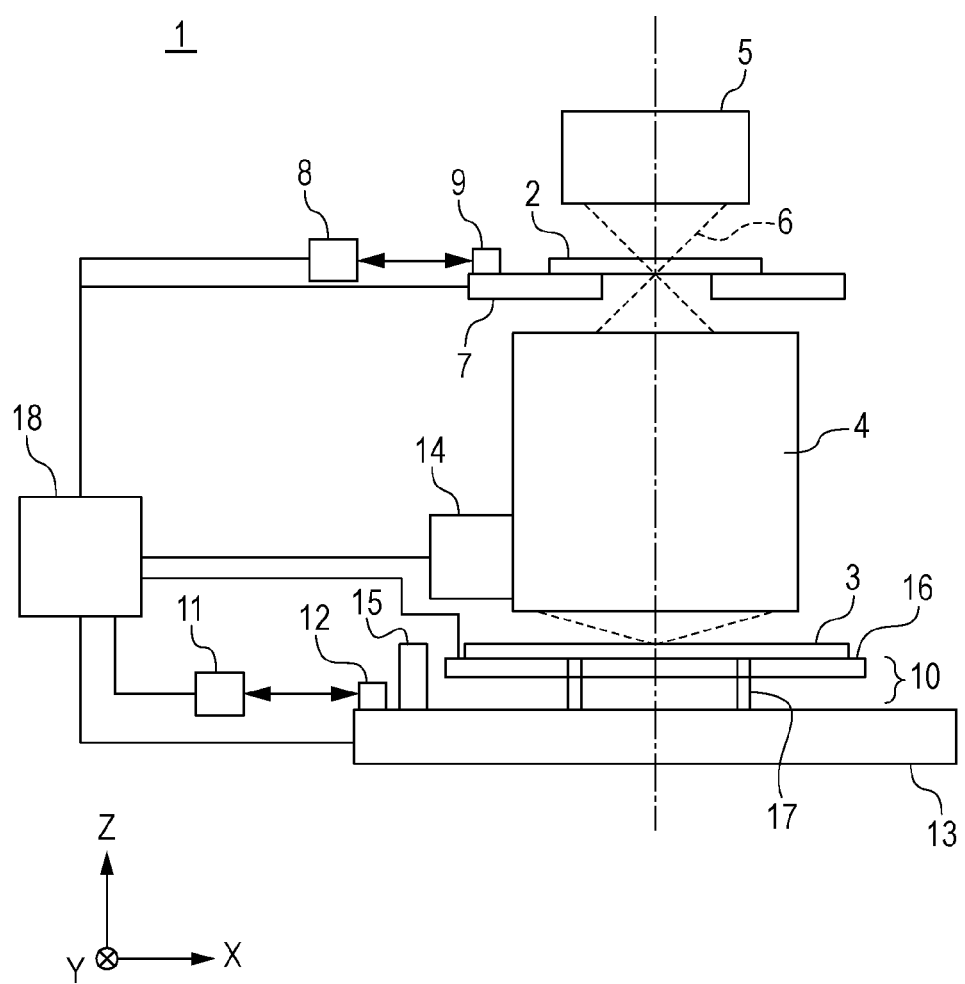
FIG. 1 is a diagram illustrating an exposure apparatus according to first to third embodiments.

The configuration of an exposure apparatus (lithography apparatus) 1 according to a first embodiment will be described with reference to FIG. 1. The exposure apparatus 1 is a projection exposure apparatus that radiates an i-line (having a wavelength of 365 nm) as illuminating light (beam) 6 onto a reticle 2 and a substrate 3 in such a manner as to scan the reticle 2 and the substrate 3 while moving the reticle 2 and the substrate 3 by a step-and-repeat system and transfers a pattern (e.g., circuit pattern or the like) formed on the reticle 2 onto the substrate 3. In FIG. 1, an axis that is parallel to a direction in which an optical axis of a projection optical system 4 extends (the vertical direction in the first embodiment) is a Z axis. In a plane perpendicular to the Z axis, a direction in which the reticle 2 moves when the reticle 2 is scanned by being irradiated with the illuminating light 6 is an X axis, and a non-scanning direction that is perpendicular to the X axis is a Y axis.

The illuminating light 6 formed by an illumination optical system 5 is radiated onto the substrate 3 via the reticle 2 and the projection optical system 4. The substrate 3 is, for example, a single-crystal silicon substrate, and a resist is applied to a surface of the substrate 3. The reticle 2 moves with a stage 7. An interferometer 8 radiates a laser beam onto a mirror 9 and receives light that has been reflected by the mirror 9 so as to detect the position of the stage 7. The stage 7 includes a stage top plate (not illustrated) for the reticle 2 and a moving mechanism (not illustrated) that moves the stage top plate.

The substrate 3 moves in six axial directions along with a holding device 10, which holds the substrate 3 by vacuum suction, and a stage 13. An interferometer 11 detects the position of the stage 13 by using a mirror 12 by a method similar to that in the case of detecting the position of the stage 7. The stage 13 includes a stage top plate (not illustrated) for the substrate 3 and a moving mechanism (not illustrated) that moves the stage top plate.

A detection system 14 detects an alignment mark (not illustrated) formed on the substrate 3 and a reference mark (not illustrated) formed on a mark table 15, which is installed on the stage 13. The detection system 14 detects the alignment mark and the reference mark, and a control unit 18, which will be described later, sets a pattern-formation position. The detection system 14 is an off-axis alignment detection system that detects the alignment mark and the reference mark without using the projection optical system 4.

A holding device 10 includes a chuck (holding member) 16 that sucks in and holds the substrate 3, pins 17 that support the substrate 3 when transporting the substrate 3 into or out of the exposure apparatus 1, and a lifting mechanism (not illustrated) that lifts and lowers the chuck 16 in the Z-axis direction. Through the operation of lifting and lowering the chuck 16, the substrate 3 is delivered to the chuck 16 from the pins 17 when the substrate 3 is transported into the exposure apparatus 1, and the substrate 3 is delivered to the pins 17 from the chuck 16 when the substrate 3 is transported out of the exposure apparatus 1. The configuration of the holding device 10 will be described in detail later.

The control unit 18 is connected to the stages 7 and 13, the detection system 14, the interferometers 8 and 11, and the holding device 10 so as to integrally control them. For example, when an exposure process is performed, the control unit 18 sets a pattern-formation position on the basis of detection results obtained by the detection system 14 and controls the movements of the stages 7 and 13 on the basis of the positional information of the stages 7 and 13 obtained by the interferometers 8 and 11. In addition, the control unit 18 controls the movements of the lifting mechanism of the holding device 10 and the stage 13 when transporting the substrate 3 into or out of the exposure apparatus 1. The control unit 18 may be disposed in a housing in which the component members other than the control unit 18 are accommodated or may be disposed in a housing different from this housing.

Figure 2A:
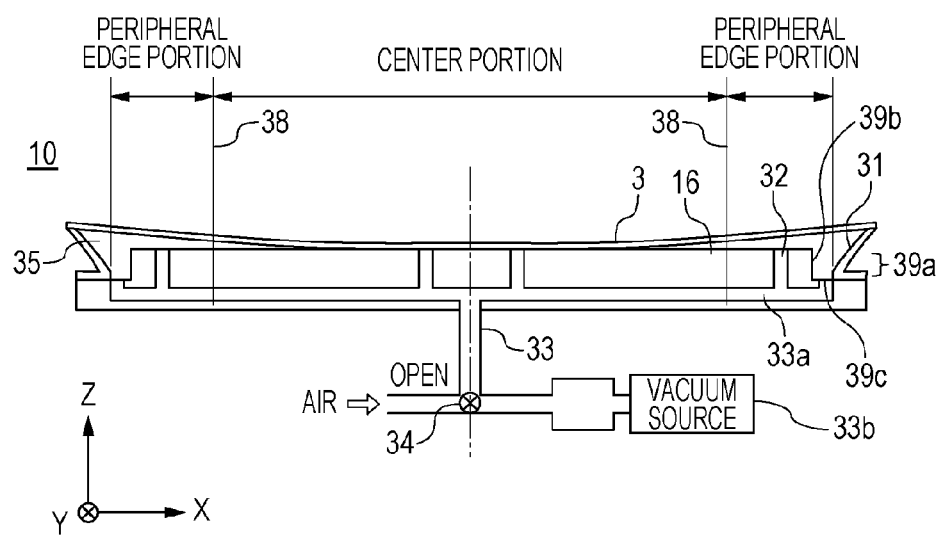
FIG. 2A and FIG. 2B are each a diagram illustrating a holding device according to the first embodiment (a sectional view as seen from the horizontal direction).
Figure 2B:
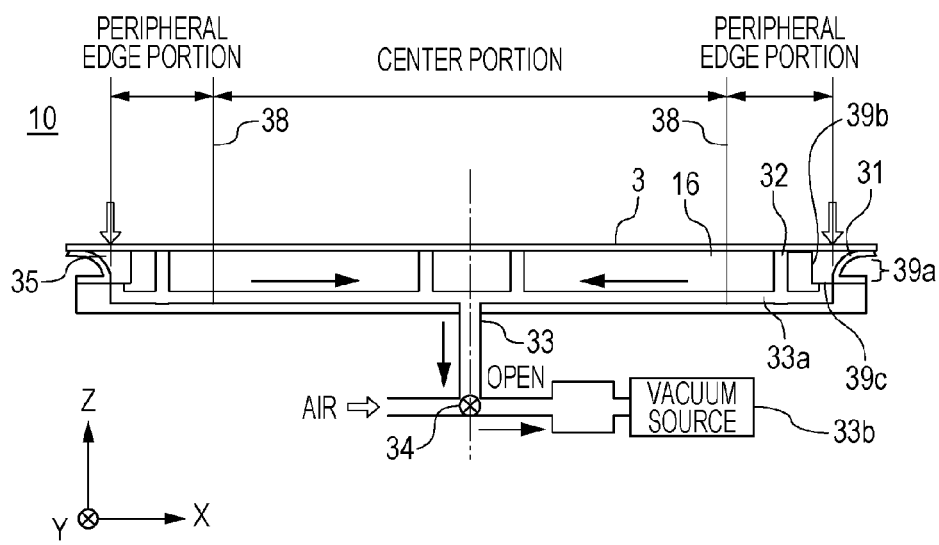

An operation of sucking in the substrate 3 will be described with reference to FIGS. 2A and 2B. FIG. 2A and FIG. 2B are each a sectional view of the X-Z plane, which passes through the center of the chuck 16, illustrating the chuck 16 and the peripheral members.

FIG. 2A illustrates a state where transportation of the substrate 3 has been completed, and the substrate 3 has been delivered to the chuck 16. The chuck 16 includes a center portion (first region) and a peripheral edge portion (second region). The boundary between the center portion and the peripheral edge portion is represented by a hypothetical boundary 38. A plurality of suction holes (intake holes) 32 are formed in the center portion and the peripheral edge portion.

Here, in the first embodiment, the center portion is, in a front surface of the chuck 16, which is a substrate-holding surface (holding surface) facing the substrate 3, a region inside a circle that is set as the boundary 38 and that is concentric with the center of the substrate-holding surface. The peripheral edge portion is a region outside the boundary 38. The boundary 38 is set in such a manner that the area of the center portion and the area of the peripheral edge portion are the same as each other. The peripheral edge portion includes a side surface 39b of a stepped portion 39a of the chuck 16. The side surface 39b is a region facing the lip seal 31, which will be described later, and is used for disposing a lip seal 31.

All the suction holes 32 are in communication with a pipe 33 as a common pipe for all the suction holes 32 via pipes 33a. The pipe 33 serves to combine the pipes 33a, which branch in such a manner as to be each coupled to a corresponding one of the suction holes 32, into one pipe. The pipe 33 is connected to a vacuum source 33b. A valve 34 is disposed between the pipe 33 and the vacuum source 33b. Whether to discharge a gas, which is present in a space between the chuck 16 and the substrate 3, through all the suction holes 32, which are connected to the vacuum source 33b via the pipe 33, or to send air into the space between the chuck 16 and the substrate 3 through all the suction holes 32, which are connected to the valve 34 via the pipe 33 can be selected by switching the valve 34. The pipe 33 is disposed at a position corresponding to the center portion of the chuck 16, that is, a position inside the boundary 38 when the chuck 16 is cut at the boundary 38 in a thickness direction of the chuck 16. In particular, as illustrated in FIGS. 2A and 2B and the like, the position of the pipe 33 in the X-Y plane may be near the center of the center portion in order to suppress a difference in the magnitude of an air-evacuation force from occurring between a position at which the distance between the suction holes 32 and the pipe 33 is short in the X-Y plane and a position at which the distance between the suction holes 32 and the pipe 33 is long in the X-Y plane.

The lip seal (seal member) 31 having a circular shape and a ring-like shape is disposed on a bottom surface 39c, which is a lower surface of the stepped portion 39a of the chuck 16. The lip seal 31 is an elastic member and is fixed to the chuck 16 with a binder, such as an adhesive sheet. When the substrate 3 is placed on the chuck 16, the lip seal 31 is brought into contact with a portion in the vicinity of the peripheral edge of the substrate 3. With this configuration, the area of a space 35 between the substrate 3 and the substrate-holding surface is defined by the lip seal 31.

The valve 34 is released to the side on which an atmospheric space is present. Although the portion in the vicinity of the peripheral edge of the substrate 3 and the lip seal 31 are in contact with each other, the portion and the lip seal 31 are not completely in close contact with each other, and there is a small gap between the portion and the lip seal 31 in accordance with the warpage of the peripheral edge of the substrate 3.

By switching the valve 34 to the side on which the vacuum source 33b is disposed from the state illustrated in FIG. 2A, the air in the space 35 is evacuated through all the suction holes 32. The operation of switching the valve 34 may be performed during the period when the chuck 16 is being lifted, that is, before the substrate 3 is completely delivered to the chuck 16 from the pins 17.

As illustrated in FIG. 2B, with the increasing negative pressure in the space 35, the substrate 3 is pressed by atmospheric pressure and becomes deformed so as to follow the shape of the substrate-holding surface of the chuck 16.

In this case, the lip seal 31 becomes deformed so as to follow the shape of the peripheral edge of the substrate 3 and gradually comes into close contact with the substrate 3.

Since an end portion of the lip seal 31 is positioned higher than the substrate-holding surface of the chuck 16, even in the case where the edge of the substrate 3 is warped, the warped portion of the substrate 3 and the lip seal 31 are likely to be brought into contact with each other. As a result, the space 35 can easily be hermetically sealed, and the air in the space 35 can be evacuated. Compared with the case where the lip seal 31 is not provided, the space 35 is more hermetically sealed, and the suction force applied to the substrate 3 increases, so that the substrate 3 can be corrected so as to be flat.

Therefore, the lip seal 31 may be a soft member that can be easily deformed and is capable of expanding and contracting. A polymeric material (elastic polymeric material) containing a synthetic rubber, such as a silicone rubber or a fluoro rubber, may be used, and alternatively, a different soft resin or a metal material may be used.

In a state where the substrate 3 is being sucked to the chuck 16 by the holding device 10, the exposure apparatus 1 performs the exposure process. After the exposure process has been completed, the holding device 10 is controlled and the substrate 3 is brought into a transportable state.

Figure 4:
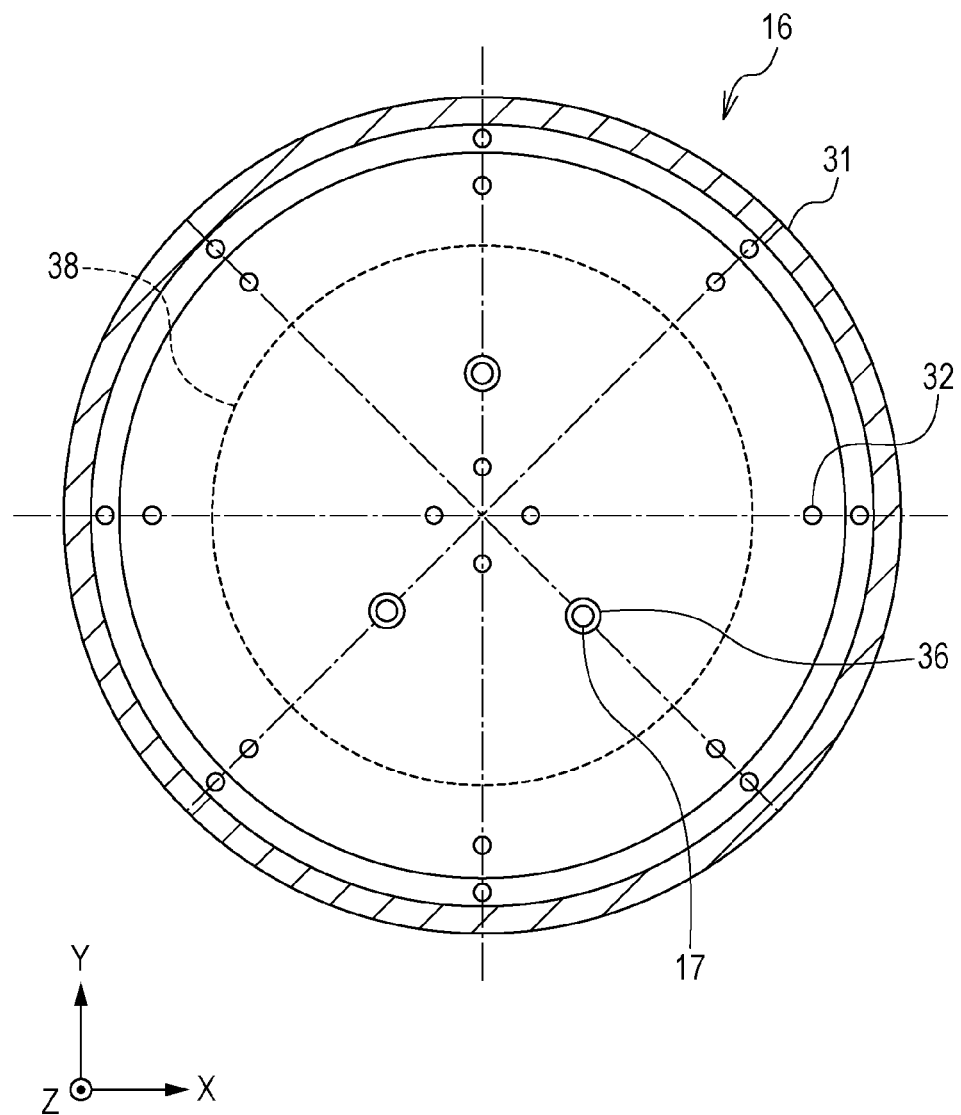
FIG. 4 is a diagram illustrating a holding device according to the first embodiment (a diagram as seen from vertically above).

FIG. 4 is a view when the chuck 16 is viewed from a positive Z-axis direction. The suction holes 32 and pin holes 36 are formed into circles that are concentric with the substrate-holding surface.

Each of the pin holes 36 is formed in such a manner as to extend through one of three portions of the chuck 16. When the lifting mechanism moves the chuck 16 in a negative Z-axis direction, the pins 17 relatively project from the inside of the pin holes 36. Since gaps between the pins 17 and the corresponding pin holes 36 are constantly closed by a seal member (not illustrated), air leakage will not occur when suction of the substrate 3 is performed.

Regarding the suction holes 32, four suction holes 32 are formed in the center portion of the chuck 16, and sixteen suction holes 32 (eight suction holes 32×two circles) are formed in the peripheral edge portion, which surrounds the center portion. All the suction holes 32 have the same diameter.

When the total cross-sectional area of all the suction holes 32 in a region is a total hole area (the total area of the intake holes), the suction holes 32 are formed in such a manner that the total hole area in the peripheral edge portion is larger than the total hole area in the center portion, that is, the total area of the intake holes formed in the second region is larger than 50% of the total area of the intake holes formed in a region that is the sum of the first region and the second region. Thus, the total hole area per unit area in the peripheral edge portion is larger than the total hole area per unit area in a region that is the sum of the center portion and the peripheral edge portion.

When the evacuation of the air in the space 35 is performed by using the vacuum source 33b via the pipe 33 by using the chuck 16, in which the suction holes 32 are formed in the above manner, the suction force in the peripheral edge portion, in which the suction holes 32 are formed at a higher ratio, is larger than the suction force in the center portion.

As a result, even in the case where the amount of the warpage of the substrate 3 is large, and a large gap is formed between the substrate 3 and the lip seal 31 after transportation of the substrate 3 has been performed, the gap can be instantly closed, and the occurrence of air leakage can be prevented. Better correction of the warpage of the substrate 3 can be performed than in the case where suction holes having the same shape are arranged at a certain pitch, and the substrate 3 has the same amount of warpage. Thus, deformation that would occur in a transferred pattern due to the deformation, such as warpage, of the substrate 3 can be prevented.

Figure 3:
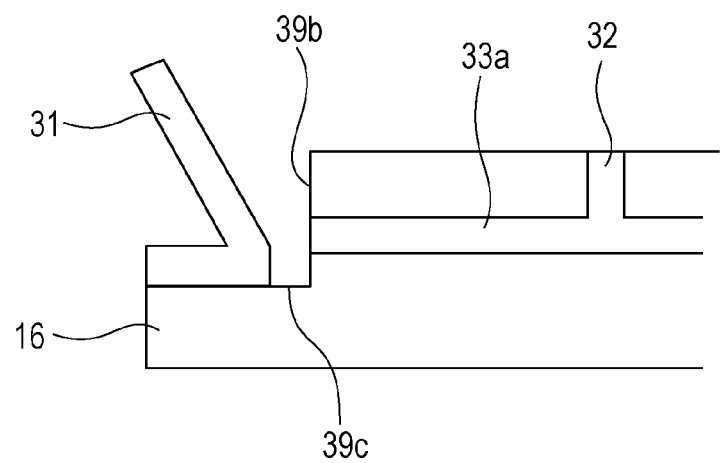
FIG. 3 is a diagram illustrating a holding device according to a modification of the first embodiment (a sectional view as seen from the horizontal direction).

At least one of the suction holes 32 may be formed in at least one of the side surface 39b and the bottom surface 39c. FIG. 3 illustrates an exemplary state where at least one of the suction holes 32 is formed in the side surface 39b.

In a state where the substrate-holding surface and the substrate 3 are in contact with each other, it is difficult to perform air evacuation via the suction holes 32, which are formed in the substrate-holding surface. Thus, there may be a case where the evacuation of the air in the space between the bottom surface 39c and the substrate 3 will not be sufficiently performed, and the correction of the warpage of the substrate 3 is insufficient. If at least one of the suction holes 32 is formed in at least one of the side surface 39b and the bottom surface 39c, the evacuation of the air in the space between the bottom surface 39c and the substrate 3 can be performed while the suction of the substrate 3 is performed so that the warpage of the substrate 3 can be corrected.

In the case where at least one of the suction holes 32 is formed in the side surface 39b, the number of holes processed in the vertical direction is small, and thus, the processing costs required for forming the suction holes 32 can be reduced.

The holding device 10 of the first embodiment can perform suction of not only a substrate that is warped downward in a convex manner into a bowl-like shape but also a substrate that is warped upward in a convex manner into an inverted bowl-like shape and a substrate that is asymmetrically warped, and these substrates can be corrected so as to be flat.

In FIG. 4, which illustrates the arrangement of the suction holes 32, the center portion may be set to be the inner region of a figure that is concentric with the center of the plane figure of the substrate-holding surface and that is obtained by reducing the size of the plane figure by $2/3$ or more and $4/5$ or less, and the peripheral edge portion may be set to be a region between the center portion and the lip seal 31.

In this case, the arrangement of the suction holes 32 satisfies a relationship of (total hole area in peripheral edge portion/area of peripheral edge portion)>(total hole area in sum region of center portion and peripheral edge portion/area of sum region of center portion and peripheral edge portion), and the total hole area per unit area in the peripheral edge portion is larger than the total hole area per unit area in the region that is the sum of the center portion and the peripheral edge portion. In other word, relationship of, ratio of total area of intake holes 32 formed in the peripheral edge portion to area of the peripheral edge portion is greater than, ratio of the total area of intake holes 32 formed in a sum region that includes the center portion added to the peripheral edge portion to area of the sum, is satisfied. As a result, the suction force in the peripheral edge portion, in which the suction holes 32 are formed at a higher ratio, can be increased.

Note that ">" is an inequality sign indicating that the expression on the left is greater than the expression on the right, and "/" is a division sign. For example, "(total hole area in peripheral edge portion/area of peripheral edge portion)" denotes the number obtained by dividing the total hole area in the peripheral edge portion by the area of the peripheral edge portion. In the present specification, the plane figure of the substrate-holding surface refers to the contour shape of the substrate-holding surface when the substrate-holding surface is viewed from the side on which the substrate 3 is to be transported into the exposure apparatus 1 in the vertical direction.

The arrangement of the suction holes 32 is not limited to that of the first embodiment, and various changes can be made. For example, like a modification of the first embodiment illustrated in FIG. 5A, two suction holes 32 may be formed in the center portion, and four suction holes 32 may be formed in the peripheral edge portion in such a manner that these suction holes 32 are in line with one another.

An example of the first embodiment will now be described. The suction effect obtained by forming the suction holes 32 in such a manner that the number of the suction holes 32 formed in the peripheral edge portion of the chuck 16 is larger than the number of the suction holes 32 formed in the center portion of the chuck 16 was confirmed by using the chuck 16 illustrated in FIG. 5A. An operation of sucking in the substrate 3 that has a bowl-like shape and that is warped upward in such a manner that the outer periphery portion of the substrate 3 is positioned higher than the center of the substrate 3 by 1.7 mm in the vertical direction. In addition, as illustrated in FIG. 5B, as a comparative example, an operation of sucking in a substrate that is warped to an amount the same as that at which the substrate 3 is warped by using a chuck 50 having six suction holes 48 formed in a center portion thereof and a lip seal 45, which is disposed along the outer periphery of the chuck 50.

A flow meter is disposed in the vicinity of the valve 34, and a flow rate (flow rate of exhaust air) required for sucking in the substrate 3 was measured by using the flow meter.

Figure 5A:
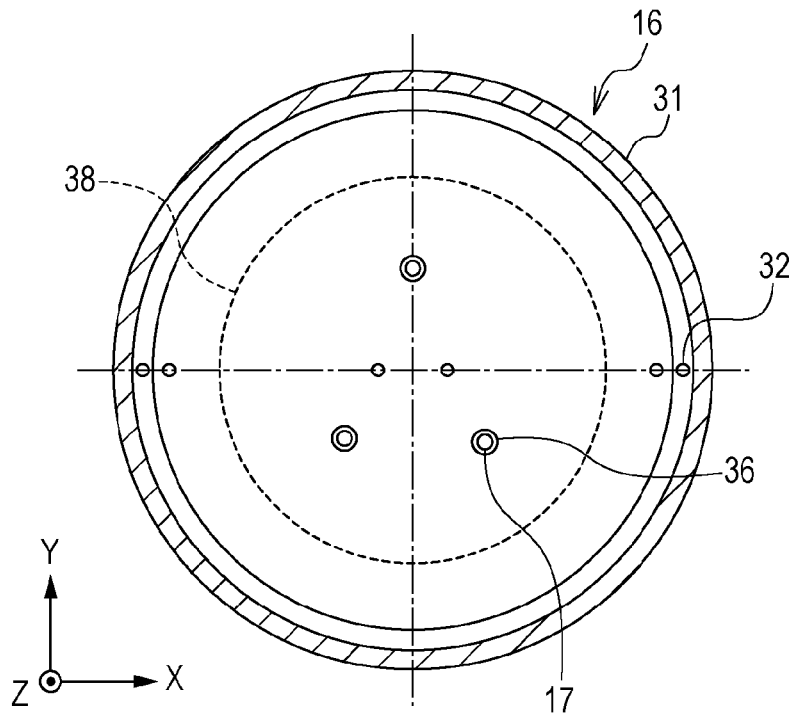
FIG. 5A and FIG. 5B are each a diagram illustrating a holding device according to an example.
Figure 5B:
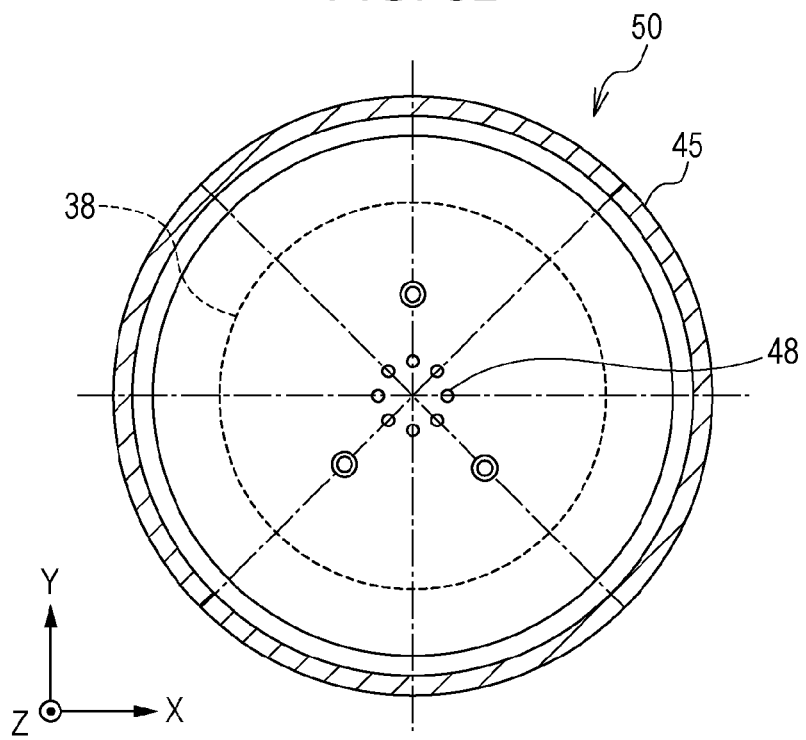

As a result, in the case of using the chuck 16 illustrated in FIG. 5A, a flow rate of 2 L/min was required, and in the case of using the chuck 50 illustrated in FIG. 5B, a flow rate of 20 L/min was required. In the case of sucking in a substrate that is warped to a large amount, the chuck 16 was able to suck in the substrate at a relatively small flow rate compared with the chuck 50.

From the results, it was found that the configuration of the chuck 16 according to the first embodiment enabled a small-sized vacuum source 33b having a low air-evacuation performance to be employed. This has an advantageous effect of reducing the amount of installation space of the vacuum source 33b and the manufacturing costs of the vacuum source 33b.

A second embodiment will now be described. The differences from the holding device 10 of the first embodiment are suction holes 37 each having a size different from that of each of the suction holes 32 and the arrangements of the suction holes 32 and 37.

Figure 6:
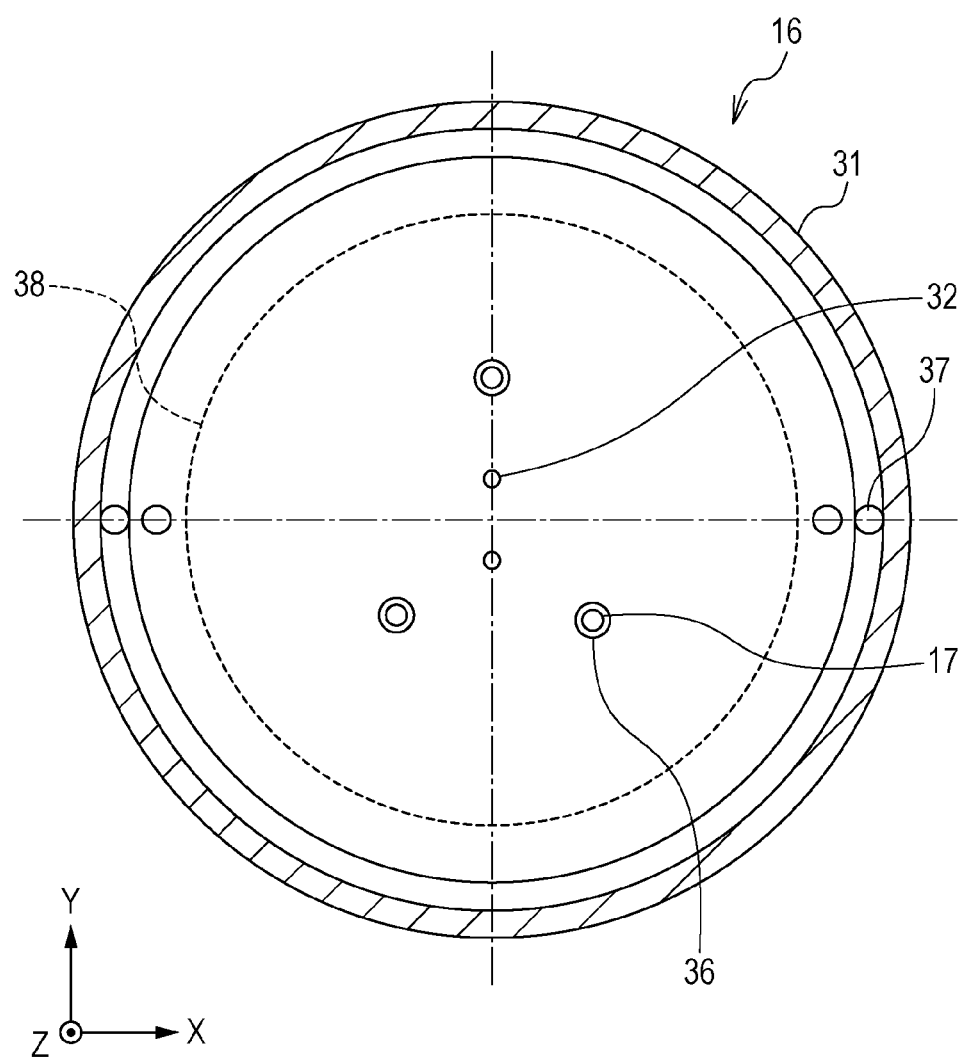
FIG. 6 is a diagram illustrating a holding device according to the second embodiment.

FIG. 6 is a view when the holding device 10 according to the second embodiment is viewed from the positive Z-axis direction. The boundary 38 represents the boundary between the center portion of the chuck 16 and the peripheral edge portion of the chuck 16, and the center portion is the inner region of a figure that is obtained by reducing the size of the plane figure of the substrate-holding surface by ⅘. In the substrate-holding surface, the peripheral edge portion is a region between the center portion and the lip seal 31.

The chuck 16 has two suction holes 32 formed in the center portion and four suction holes 37 formed in the peripheral edge portion. The hole area of one of the suction holes 37 formed in the peripheral edge portion is twice or more the hole area of one of the suction holes 32 formed in the center portion. The suction holes 32 are arranged along the Y-axis direction, and the suction holes 37 are arranged along the X-axis direction.

Also in the second embodiment, the total hole area per unit area in the peripheral edge portion is larger than the total hole area per unit area in a region that is the sum of the center portion and the peripheral edge portion. By arranging the suction holes 32 in such a manner that the above relationship is satisfied even in the case where the center portion is the inner region of a figure that is obtained by reducing the size of the plane figure of the substrate-holding surface by ⅘, the suction force in the end portion of the substrate 3 further increases.

This facilitates, like in the first embodiment, the correction of the warpage of the substrate 3 compared with the case where suction holes having the same shape are arranged at a certain pitch. Thus, deformation that would occur in a transferred pattern due to the deformation, such as warpage, of the substrate 3 can be prevented. In addition, by arranging the vacuum source 33b having a low exhaust-air rate, a reduction in the amount of installation space of the vacuum source 33b and a reduction in the manufacturing costs of the vacuum source 33b can be achieved.

The number of suction holes 37 formed in the peripheral edge portion is reduced by increasing the hole area of each of the suction holes 37 formed in the peripheral edge portion. The number of pipes formed within the chuck 16, the pipes extending from the center of the chuck 16 to the suction holes 37, can be reduced, and accordingly, a reduction in the processing costs can be achieved.

The suction holes 37 are arranged in such a manner that all the suction holes 37 (at least three of the suction holes 37) are not in line with one another as described above with reference to FIG. 5A. This prevents the distribution of the negative pressure in the space 35 from being uneven in one axial direction.

Both in the first embodiment and the second embodiment, even in the case where no suction hole 32 is formed in the center portion (even in the case where the total hole area in the peripheral edge portion is 100% of the region that is the sum of the center portion and the peripheral edge portion), suction of the substrate 3 can be performed. However, at least one suction hole 32 may be formed in the center portion because if no suction hole 32 is formed in the center portion, there is a possibility that a region in which warpage has still remained will be left at the center of the substrate 3 as a result of the substrate 3 being corrected so as to be flat starting from the end portion thereof.

A third embodiment will now be described. FIG. 7 is a view when the holding device 10 according to the third embodiment is viewed from the positive Z-axis direction. The suction holes 32 of the chuck 16 have the same size and the same shape and are formed so as to be arranged at a certain pitch. In FIG. 7, the inner region of a figure that is obtained by reducing the size of the plane figure of the substrate-holding surface by ⅔ is the center portion. However, the center portion may be the inner region of a figure that is obtained by reducing the size of the plane figure of the substrate-holding surface by ⅔ or more and ⅘ or less.

Pipes connected to the suction holes 32 that belong to a first region, which is the center portion of the chuck 16, and pipes connected to the suction holes 32 that belong to a second region, which is the peripheral edge portion of the chuck 16, are provided with valves (not illustrated) that are capable of being opened and closed on a region-by-region basis. A control unit 55 controls opening and closing of the valve corresponding to the center portion and the valve corresponding to the peripheral edge portion. The control unit 55 controls the flow rate of the air exhausted through the suction holes 32 formed in the center portion and the flow rate of the air exhausted through the suction holes 32 formed in the peripheral edge portion at a predetermined timing during air evacuation in such a manner that a relationship of (exhaust-air flow rate of air evacuation performed via suction holes 32 formed in peripheral edge portion/area of peripheral edge portion)>(exhaust-air flow rate of air evacuation performed via suction holes 32 formed in sum region of center portion and peripheral edge portion/area of sum region of center portion and peripheral edge portion). In other word, a relationship of, ratio of exhaust-air flow rate of air evacuation performed through intake holes 32 formed in the peripheral edge portion to area of the peripheral edge portion is greater than, ratio of exhaust-air flow rate of air evacuation performed through intake holes 32 in a sum region that includes the center portion added to the peripheral edge portion to area of the sum region, is satisfied.

For example, the control unit 55 sucks in the substrate 3 by using only the suction holes 32 formed in the center portion, then closes the valve of the pipes that are connected to the suction holes 32 formed in the center portion, and after that sucks in the substrate 3 by using only the suction holes 32 formed in the peripheral edge portion. As a result of the control unit 55 performing control in this manner, air evacuation is temporarily performed only via the suction holes 32 formed in the peripheral edge portion. In this manner, the suction force in the peripheral edge portion can be increased. In addition, by employing the vacuum source 33b having a low air-evacuation performance, a reduction in the amount of installation space of the vacuum source 33b and a reduction in the manufacturing costs of the vacuum source 33b can be achieved.

The adjustment of the exhaust-air flow rate in the first region and the adjustment of the exhaust-air flow rate in the second region may respectively be performed by adjusting the degree of opening of the valve corresponding to the center portion and the degree of opening of the valve corresponding to the peripheral edge portion as long as the exhaust-air flow rate in the first region and the exhaust-air flow rate in the second region can be controlled in such a manner that, at a certain time, the total exhaust-air flow rate per unit area in the peripheral edge portion may sometimes be higher than the total exhaust-air flow rate per unit area when air evacuation is performed via all the suction holes 32.

Figure 8A:
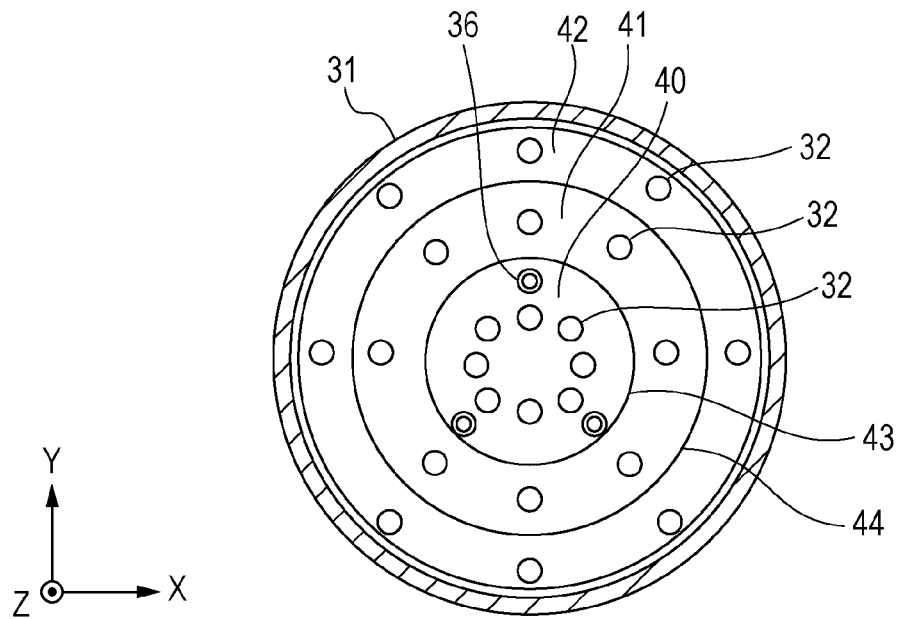
FIG. 8A and FIG. 8B are each a diagram illustrating a holding device according to a modification of the third embodiment.
Figure 8B:
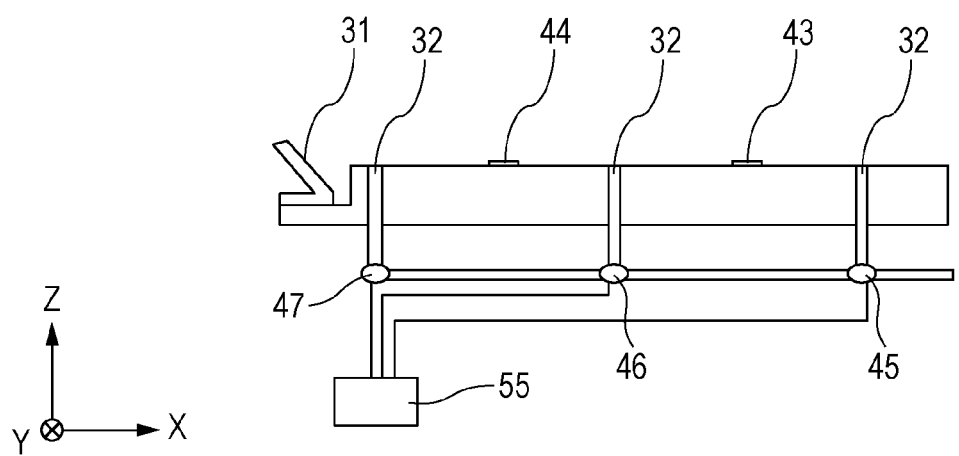

As another example, the chuck 16 may include ring-shaped protruding portions 43 and 44 that are formed on the chuck 16 in this order in a direction from the center of the chuck 16 toward the outside as illustrated in FIGS. 8A and 8B. Eight suction holes 32 are formed in each of a region 40 surrounded by the protruding portion 43, a region 41 surrounded by the protruding portion 43 and the protruding portion 44, and a region 42 located outside the protruding portion 44.

Air evacuation through the suction holes 32 that are positioned in the region 40 is performed by switching a valve 45 to the side on which a vacuum source is disposed. Air evacuation through the suction holes 32 that are positioned in the region 41 is performed by switching a valve 46 to the side on which the vacuum source is disposed. Air evacuation through the suction holes 32 that are positioned in the region 42 can be performed by switching a valve 47 to the side on which the vacuum source is disposed. The valves 45, 46, and 47 are connected to the control unit 55, and the control unit 55 controls the switching of the suction holes 32 to be used for sucking in the substrate 3 in accordance with a predetermined timing.

The third embodiment, which has been described above, is suitable for the case where the height of an end portion of the lip seal 31 cannot be set to be very large with respect to the height of the substrate-holding surface in order to prevent a transport hand (not illustrated) that transports the substrate 3 to the chuck 16 from coming into contact with the lip seal 31. In other words, the third embodiment is suitable for the case where the difference in height between the pins 17 and the end portion of the lip seal 31 becomes small when transporting the substrate 3 into or out of the exposure apparatus 1.

In the case where the height of the lip seal 31 is sufficiently large, it is easy for the lip seal 31 to come into contact with a warped portion of the edge of the substrate 3. However, in the case where the height of the lip seal 31 is small, there is a possibility that the lip seal 31 will not be able to come into contact with the substrate 3 depending on the amount of the warpage of the substrate 3, so that evacuation of the air in the space 35 will not be sufficiently performed.

By switching the valves 45, 46, and 47 in this order, the substrate 3 can be sucked in such a manner that the distance between the lip seal 31 and the end of the substrate 3 is gradually reduced. After the lip seal 31 and the substrate 3 have been brought into contact with each other, the exhaust-air flow rate per unit area of the suction holes 32 in the region 42 is controlled so as to be larger than the exhaust-air flow rate per unit area of the suction holes 32 in the region 40 and the exhaust-air flow rate per unit area of the suction holes 32 in the region 41.

With this configuration, the contact between the lip seal 31 and the transport hand can be prevented, and in addition, the warpage of the substrate 3 can be corrected.

Other Embodiments

In the first to third embodiments, the air in the space between the valve 34 and the vacuum source 33b may be evacuated during the period when transportation of the substrate 3 is performed. In this case, the air in the space 35 can be evacuated in one stroke upon start of an evacuation operation, and the suction of the substrate 3 can be easily performed even if the vacuum source 33b has a low exhaust-air flow rate.

An embodiment in which the order in which the suction holes 32 are released is controlled like the third embodiment may be combined with the chuck 16 in which the suction holes 32 are formed so as to be arranged in the manner according to one of the above-described embodiments.

The shape of each of the suction holes 32 is not limited to a circular shape and may be an elliptical shape or a quadrangular shape. The lip seal 31 may be arranged in such a manner that an end of the lip seal 31 is positioned further inside than a cutout region, such as a notch or an orientation flat formed as a standard. Deterioration of the lip seal 31 can be prevented by causing exposure light not to be radiated directly into the lip seal 31.

Regarding the arrangement of the suction holes 32, the suction holes 32 may be at least formed so as to be symmetric with respect to one axis passing through the center of the substrate-holding surface. In this case, local formation of a region that cannot be corrected so as to be flat as a result of unevenness occurring in the distribution of the suction force applied to the substrate 3 can be prevented.

A plurality of pins (not illustrated) that are formed integrally with the chuck 16 may be disposed on the substrate-holding surface in order to reduce a contact area between the substrate-holding surface and the substrate 3. By reducing the contact area between the substrate-holding surface and the substrate 3, attachment of dust on the holding surface to the substrate 3 can be prevented.

In addition, in the case where the ability of the lip seal 31 to seal a space is insufficient, a protrusion structure (not illustrated) that is integrally formed with the chuck 16 may be formed on a portion of the substrate-holding surface that is positioned further inside than the lip seal 31. As a result of the protrusion structure secondarily defining a space, the center portion of the substrate 3 can be easily corrected so as to be flat. However, the suction holes 32 that are used for correcting the warpage of the substrate 3 by evacuating the air in a space outside a ring-shaped protrusion structure, which is positioned further inside than the lip seal 31, need to be formed in a region outside the ring-shaped protrusion structure, which is positioned further inside than the lip seal 31.

However, even in the case where the above-mentioned pins and the ring-shaped protrusion structure are formed, it is considered that, in the area of the substrate-holding surface, the area of the center portion, and the area of the peripheral edge portion, there is no increase in surface area due to the pins and the ring-shaped protrusion structure.

The shape of each of the plane figures of the chuck 16 and the substrate-holding surface is not limited to a circular shape. For example, in the case where the substrate-holding surface has a quadrangular shape, the center portion is a similar figure that is concentric with the center of the quadrangular shape and that is obtained by reducing the size of the quadrangular shape by ⅔ or more and ⅘ or less.

The lip seal 31 does not need to be formed on a horizontal plane as in the first to third embodiments. For example, the lip seal 31 may be fixed to a side surface of the chuck 16.

Figure 9:
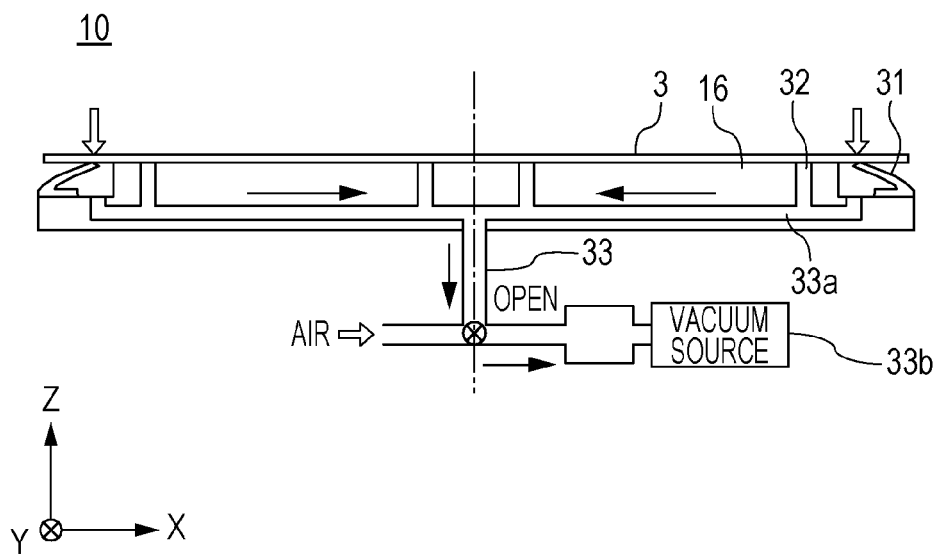
FIG. 9 is a first explanatory diagram illustrating another shape of a lip seal.

The lip seal 31 may have a shape in which an end of the lip seal 31 faces the center of the chuck 16 (FIG. 9). In this case, the lip seal 31 is likely to be deformed toward the center portion in an operation of sucking in the substrate 3, and thus, the substrate 3 is more likely to come into close contact with the lip seal 31, so that correction of the warpage of the peripheral edge of the substrate 3 is facilitated.

Figure 10:
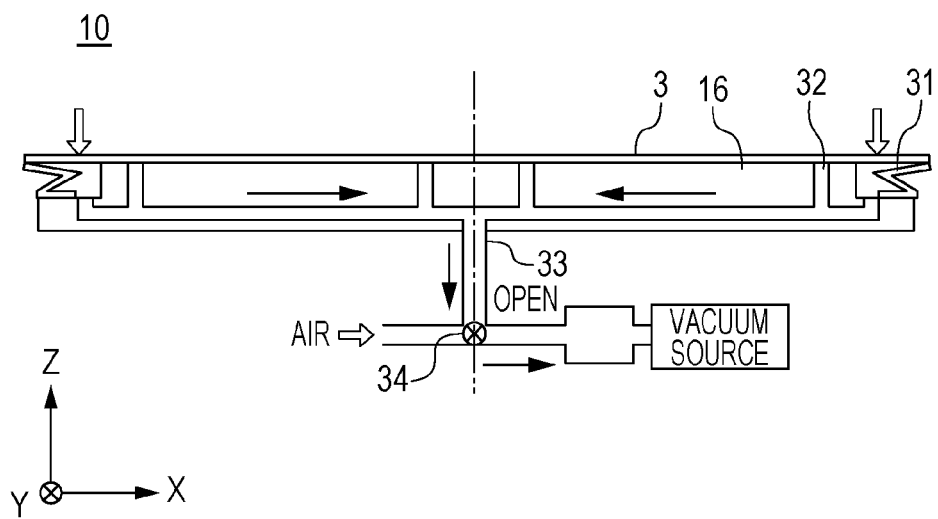
FIG. 10 is a second explanatory diagram illustrating another shape of the lip seal.

Alternatively, the cross-sectional shape of the lip seal 31 may be an accordion shape (FIG. 10). The lip seal 31 may have low rigidity because, in this case, the degree of contact between the lip seal 31 and the substrate 3 can be improved. However, it is difficult to form the lip seal 31 so as to have a thickness not larger than a predetermined thickness due to a limitation on a process for manufacturing the lip seal 31. Thus, if the rigidity of a portion of the lip seal 31 that comes into contact with the substrate 3 is reduced by using the lip seal 31 having an accordion shape, the substrate 3 is likely to come into close contact with the lip seal 31, and the correction of the warpage of the peripheral edge of the substrate 3 is facilitated. This configuration is particularly suitable for the case of sucking in the substrate 3 that is symmetrically warped with respect to one axis passing through the center of the substrate 3 or the substrate 3 that has an asymmetrical shape.

In the holding device 10 that includes the lip seal 31, the substrate 3 may sometimes be displaced by about 10 μm to about 1,000 μm in a predetermined direction before and after an operation of sucking in the substrate 3 due to an individual difference or a mounting error occurred in a process for manufacturing the lip seal 31. In this case, the positional deviation of the substrate 3 is measured by using the detection system 14 before exposure is started, and a correction amount is calculated by an operation circuit included in the control unit 18 or the like. Then, the stages 7 and 13 are moved so as to be scanned given to the correction amount. This can reduce the amount of the positional deviation of the substrate 3 that occurs due to the lip seal 31 and prevent deterioration of overlay precision.

The angle of the lip seal 31 is not limited to the angle illustrated in FIG. 2A and may be suitably changed in a range of 0 degrees to 180 degrees. If the angle of the lip seal 31 is set to be small given the fact that it becomes difficult to correct a portion of the substrate 3 that is positioned further toward the side on which the outer periphery of the substrate 3 is present than a contact point of the substrate 3 and the lip seal 31 so as to be flat, the substrate 3 and the lip seal 31 are likely to come into close contact with each other.

In FIG. 4, the lip seal 31 is directly fixed to the chuck 16. However, replacement of the lip seal 31 may be facilitated by fixing the lip seal 31 in place by using an additional component. The lip seal 31 may have a configuration in which an end portion of the lip seal 31 that has been worn away is individually replaceable by separating the lip seal 31 into an end portion including a portion that is brought into contact with the substrate 3 and other portions.

Although the case where an air-releasing operation is performed by switching the valve 34 when transporting the substrate 3 out of the exposure apparatus 1 after the exposure process has been performed has been described in the above embodiments, a small hole that is not connected to the vacuum source 33b but connected to an atmospheric space may be formed separately from the suction holes 32 so as to let the air enter the space 35.

The light that is radiated onto the substrate 3 from the lithography apparatus according to the present invention is not limited to the i-line (having a wavelength of 365 nm) and may be light in the far-ultraviolet region, such as KrF light (having a wavelength of 248 nm) or ArF light (having a wavelength of 193 nm), or may be a g-line (having a wavelength of 436 nm), which is light in the visible light region.

In addition, the lithography apparatus according to the present invention is not limited to an exposure apparatus. The present invention may be applied to an apparatus that radiates a charged-particle beam onto a substrate and forms a latent image pattern on the substrate or an apparatus that forms a pattern on a substrate by an imprint method.

Method for Manufacturing Item

A method for manufacturing an item (semiconductor integrated circuit element, liquid crystal display element, image pickup element, magnetic head, CD-RW, optical element, photomask, or the like) according to an embodiment of the present invention includes a step of exposing a substrate (wafer, glass plate, or the like) to light so as to form a pattern on the substrate by using a lithography apparatus and a step of performing at least one of an etching operation and an ion implantation operation on the substrate that has been exposed to the light. The method may further include other well-known processing steps (development, oxidation, film formation, vapor deposition, flattening, resist separation, dicing, bonding, packaging, and the like).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-242525, filed Nov. 28, 2014, and No.

2015-210712, filed Oct. 27, 2015, which are hereby incorporated by reference herein in their entirety.

What is claimed is:

1. A holding device that is configured to hold a substrate comprising:
a holding member in which a plurality of intake holes used for evacuating air in a space between a substrate and the holding member are formed; and
a seal member that has a ring shape and is disposed on a lower surface of a stepped portion of the holding member and that defines the space,
wherein, when an inner region of a figure that is concentric with a center of a plane figure of a holding surface of the holding member and that is obtained by reducing a size of the plane figure by $2/3$ or more and $4/5$ or less is set as a first region, and a region between the first region and the seal member is set as a second region, the plurality of intake holes are formed in such a manner that a relationship of, ratio of total area of intake holes formed in the second region to area of the second region is greater than, ratio of the total area of intake holes formed in a sum region that includes the first region added to the second region to area of the sum region, is satisfied, and
wherein the plurality of intake holes are in communication with a common pipe.

2. The holding device according to claim 1,
wherein at least one of the intake holes is formed in the first region.

3. The holding device according to claim 2,
wherein a hole area of one of the intake holes in the second region is twice or more of a hole area of one of the intake holes in the first region.

4. The holding device according to claim 1,
wherein the first region is an inner region of a figure that is obtained by reducing the size of the plane figure by $4/5$.

5. The holding device according to claim 1,
wherein the plurality of intake holes formed in the holding member are three or more intake holes, and at least three of the intake holes are not in line with one another.

6. The holding device according to claim 1,
wherein at least one of the intake holes is formed in a side surface of the stepped portion in such a manner as to face the seal member.

7. The holding device according to claim 1,
wherein the seal member is made of an elastic polymeric material.

8. A holding device that is configured to hold a substrate comprising:
a holding member in which a plurality of intake holes used for evacuating air in a space between a substrate and the holding member are formed;
a seal member that has a ring shape and is disposed on a lower surface of a stepped portion of the holding member and that defines the space; and
a control unit that controls an exhaust-air flow rate of air evacuation performed through the plurality of intake holes,
wherein the plurality of intake holes are in communication with a common pipe, and
wherein, when an inner region of a figure that is concentric with a center of a plane figure of a holding surface of the holding member and that is obtained by reducing a size of the plane figure by $2/3$ or more and $4/5$ or less is set as a first region, and a region between the first region and the seal member is set as a second region, the control unit controls the exhaust-air flow rate in such a manner that a relationship of ratio of exhaust-air flow rate of air evacuation performed through intake holes formed in the second region to area of the second region is greater than, ratio of exhaust-air flow rate of air evacuation performed through intake holes in a sum region that includes the first region added to the second region to area of the sum region, is satisfied.

9. The holding device according to claim 8,
wherein at least one of the intake holes is formed in a side surface of the stepped portion in such a manner as to face the seal member.

10. A holding device that is configured to hold a substrate comprising:
a holding member in which a plurality of intake holes used for evacuating air in a space between a substrate and the holding member are formed; and
a seal member that has a ring shape and is disposed on a lower surface of a stepped portion of the holding member and that defines the space,
wherein, when a circle that is concentric with a center of a holding surface of the holding member is set such that an area of a first region of the holding member that is located inside the circle and an area of a second region of the holding member that is located outside the circle are equal to each other, the plurality of intake holes are formed in such a manner that a total area of the intake holes formed in the second region is larger than 50% of a total area of the intake holes formed in a region that is a sum of the first region and the second region.

11. The holding device according to claim 10,
wherein the plurality of intake holes are formed in such a manner that the total area of the intake holes formed in the second region is 100% or lower of the total area of the intake holes formed in the region that is the sum of the first region and the second region.

12. A lithography apparatus that radiates a beam onto a substrate and forms a pattern on the substrate, the lithography apparatus comprising:
a holding device that holds a substrate,
wherein the holding device includes
a holding member in which a plurality of intake holes used for evacuating air in a space between the substrate and the holding member are formed and
a seal member that has a ring shape and is disposed on a lower surface of a stepped portion of the holding member and that defines the space,
wherein, when an inner region of a figure that is concentric with a center of a plane figure of a holding surface of the holding member and that is obtained by reducing a size of the plane figure by $2/3$ or more and $4/5$ or less is set as a first region, and a region between the first region and the seal member is set as a second region, the plurality of intake holes are formed in such a manner that a relationship of, ratio of total area of intake holes formed in the second region to area of the second region is greater than, ratio of the total area of intake holes formed in a sum region that includes the first region added to the second region to area of the sum region, is satisfied, and
wherein the plurality of intake holes are in contact with a pipe that is disposed at a position corresponding to the first region of the holding member.

13. A lithography apparatus that radiates a beam onto a substrate and forms a pattern on the substrate, the lithography apparatus comprising:
a holding device that holds a substrate, wherein the holding device includes
a holding member in which a plurality of intake holes used for evacuating air in a space between the substrate and the holding member are formed,
a seal member that has a ring shape and is disposed on a lower surface of a stepped portion of the holding member and that defines the space, and
a control unit that controls an exhaust-air flow rate of air evacuation performed through the plurality of intake holes,
wherein the plurality of intake holes are in communication with a common pipe, and
wherein, when an inner region of a figure that is concentric with a center of a plane figure of a holding surface of the holding member and that is obtained by reducing a size of the plane figure by ⅔ or more and ⅘ or less is set as a first region, and a region between the first region and the seal member is set as a second region, the control unit controls the exhaust-air flow rate in such a manner that a relationship of ratio of exhaust-air flow rate of air evacuation performed through intake holes formed in the second region to area of the second region is greater than, ratio of exhaust-air flow rate of air evacuation performed through intake holes in a sum region that includes the first region added to the second region to area of the sum region, is satisfied.

14. A lithography apparatus that radiates a beam onto a substrate and forms a pattern on the substrate, the lithography apparatus comprising:
a holding device that holds a substrate,
wherein the holding device includes
a holding member in which a plurality of intake holes used for evacuating air in a space between a substrate and the holding member are formed and
a seal member that has a ring shape and is disposed on a lower surface of a stepped portion of the holding member and that defines the space,
wherein, when a circle that is concentric with a center of a holding surface of the holding member is set such that an area of a first region of the holding member that is located inside the circle and an area of a second region of the holding member that is located outside the circle are equal to each other, the plurality of intake holes are formed in such a manner that a total area of the intake holes formed in the second region is larger than 50% of a total area of the intake holes formed in a region that is a sum of the first region and the second region.

15. A method for manufacturing an item comprising:
radiating a beam onto a substrate by using a lithography apparatus; and
performing at least one of an etching operation and an ion implantation operation on the substrate,
wherein the lithography apparatus is a lithography apparatus that includes a holding device that holds the substrate and that radiates the beam onto the substrate and forms a pattern on the substrate,
wherein the holding device includes
a holding member in which a plurality of intake holes used for evacuating air in a space between the substrate and the holding member are formed and
a seal member that has a ring shape and is disposed on a lower surface of a stepped portion of the holding member and that defines the space,
wherein, when an inner region of a figure that is concentric with a center of a plane figure of a holding surface of the holding member and that is obtained by reducing a size of the plane figure by ⅔ or more and ⅘ or less is set as a first region, and a region between the first region and the seal member is set as a second region, the plurality of intake holes are formed in such a manner that a relationship of, ratio of total area of intake holes formed in the second region to area of the second region is greater than, ratio of the total area of intake holes formed in a sum region that includes the first region added to the second region to area of the sum region, is satisfied, and
wherein the plurality of intake holes are in contact with a pipe that is disposed at a position corresponding to the first region of the holding member.

* * * * *